United States Patent [19]
Doan et al.

[11] Patent Number: 5,514,245
[45] Date of Patent: May 7, 1996

[54] METHOD FOR CHEMICAL PLANARIZATION (CMP) OF A SEMICONDUCTOR WAFER TO PROVIDE A PLANAR SURFACE FREE OF MICROSCRATCHES

[75] Inventors: Trung T. Doan; Malcolm Grief; Laurence D. Schultz, all of Boise, Id.

[73] Assignee: Micron Technology, Inc., Boise, Id.

[21] Appl. No.: 430,276

[22] Filed: Apr. 28, 1995

Related U.S. Application Data

[63] Continuation-in-part of Ser. No. 101,657, Aug. 4, 1993, abandoned, which is a continuation of Ser. No. 826,394, Jan. 27, 1992, abandoned.

[51] Int. Cl.$^6$ ................................................. H01L 21/306
[52] U.S. Cl. .................................... 156/636.1; 437/228
[58] Field of Search ........................... 156/636; 437/228, 437/228 POL, 228 PL

[56] References Cited

U.S. PATENT DOCUMENTS

| | | | |
|---|---|---|---|
| 3,841,031 | 10/1974 | Walsh | 51/283 R |
| 4,193,226 | 3/1980 | Gill, Jr. et al. | 51/124 R |
| 4,680,893 | 7/1987 | Cronkhite et al. | 51/283 R |
| 4,811,522 | 3/1989 | Gill, Jr. | 51/131.1 |
| 5,142,828 | 9/1992 | Curry | 51/281 R |

FOREIGN PATENT DOCUMENTS

| | | | |
|---|---|---|---|
| 0226931 | 6/1987 | European Pat. Off. | 156/636 |
| 2-34925 | 2/1990 | Japan . | |

OTHER PUBLICATIONS

W. J. Patrick et al., "Application of Chemical Mechanical Polishing . . . ", *J. Electrochem. Soc.*, vol. 138, No. 6, Jun. 1991, pp. 1178–1184.

"Polishing with Napped Poromerics: An Overview", *Surface Tech. Review*, vol. 1, Issue 1, Dec. 1986, pp. 1–4.

WLCM Heyboer et al., "Chemomechanical Silicon Processing" *Solid–State Science and Technology, J. Electrochem Soc.*, vol. 138, No. 3, Mar. 1991, pp. 774–777.

V. Y. Pickhardt et al., "Chemomechanical Polishing of C & S", *Journal Electrochem. Soc., Solid–State Science and Tech*, Aug. 1974, pp. 1064–1066.

C. Yu et al., "Submicron AL Plug Process Utilizing High Temperature Sputtering and Chemical Mechanical Polishing", Conference Preceedings ULSI–VII, 1992 Material Research Society, pp. 519–525.

*Surface Tech Review* vol. 1, Issue 6, (May 1989) pp. 1–4.

*Primary Examiner*—Tom Thomas
*Assistant Examiner*—Lynne A. Gurley
*Attorney, Agent, or Firm*—Stephen A. Gratton

[57] ABSTRACT

A method of chemically-mechanically planarizing (CMP) a dielectric layer formed on semiconductor wafer includes planarizing the dielectric layer with a polishing pad formed of a hard low compressibility pad material, and then polishing the dielectric layer with a polishing pad formed of a soft compressible pad material to remove micro-scratches formed during the planarization step. During the planarization step, the hard low compressibility pad material does not deform into the surface of the dielectric layer and the dielectric layer is planarized along a single contact plane. A loading effect in which the a material compresses and produces an irregular surface is thus eliminated.

17 Claims, 6 Drawing Sheets

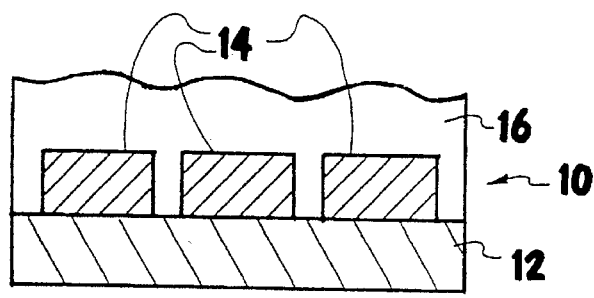
FIGURE 1 (Prior Art)
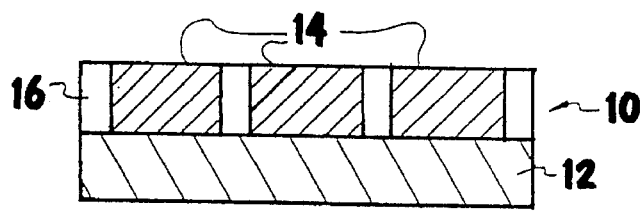
FIGURE 2 (Prior Art)
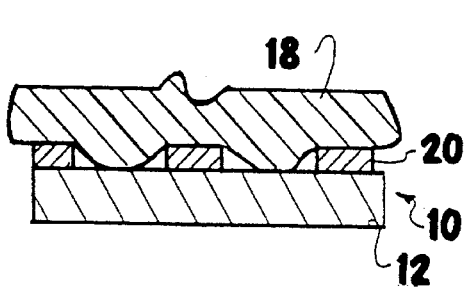 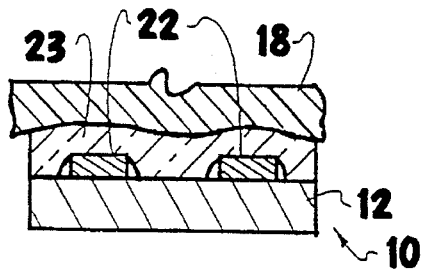
FIGURE 3 (Prior Art)   FIGURE 4 (Prior Art)
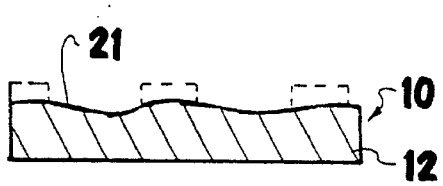 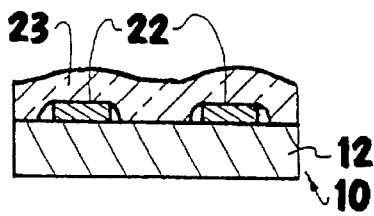
FIGURE 3A (Prior Art)   FIGURE 4A (Prior Art)

METHOD FOR CHEMICAL PLANARIZATION (CMP) OF A SEMICONDUCTOR WAFER TO PROVIDE A PLANAR SURFACE FREE OF MICROSCRATCHES

This is a continuation-in-part of application Ser. No. 08/101,657 filed Aug. 4, 1993, now abandoned, which is a continuation of application Ser. No. 07/826,394 filed Jan. 27, 1992, now abandoned.

TECHNICAL FIELD

This invention relates to semiconductor manufacture and more particularly to a novel method for chemical mechanical planarization (CMP) of a semiconductor wafer.

BACKGROUND OF THE INVENTION

In the fabrication of integrated circuits (ICs), it is often necessary to polish a side of a part such as a thin flat wafer of a semiconductor material. In general, a semiconductor wafer can be polished to provide a planarized surface to remove topography, surface defects such as a crystal lattice damage, scratches, roughness, or embedded particles such as dirt or dust. This polishing process is often referred to as mechanical planarization or chemical mechanical planarization (CMP) and is utilized to improve the quality and reliability of semiconductor devices. The (CMP) process is usually performed during the formation of various devices and integrated circuits (ICs) on the wafer.

In general, the chemical mechanical planarization (CMP) process involves holding a thin flat wafer of semiconductor material against a rotating wetted polishing surface under a controlled downward pressure. A polishing slurry such as a solution of alumina or silica may be utilized as the abrasive medium. A rotating polishing head or wafer carrier is typically utilized to hold the wafer under controlled pressure against a rotating polishing platen. The polishing platen is typically covered with a relatively soft wetted pad material such as blown polyurethane.

Such apparatus for polishing thin flat semiconductor wafers are well known in the art. U.S. Pat. Nos. 4,193,226 and 4,811,522 to Gill, Jr. and U.S. Pat. No. 3,841,031 to Walsh, for instance, disclose such apparatus.

FIGS. 1–2 illustrate the effect of the chemical mechanical planarization (CMP) process on a semiconductor wafer. As shown in FIG. 1, a semiconductor wafer 10 includes a substrate 12 on which a plurality of IC devices 14 have been formed. The wafer substrate 12 is typically formed of a single crystal silicon material. The IC devices 14 are typically formed by patterning regions and layers on the substrate. A chemical mechanical planarization (CMP) process may be utilized, for instance, to remove and planarize a portion of a layer such as an oxide coating 16.

As an example, and as shown in FIG. 2, it may be necessary to remove the oxide coating 16 to a planar end point such as to the level of the IC devices 14 to form insulating spacers between the IC devices 14. This can be accomplished by a chemical mechanical planarization (CMP) process. Alternately it may be necessary to remove some feature or structure formed on the substrate 12 to an end point of or to the surface of the substrate 12. Other semiconductor manufacturing processes such as polishing, roughening or thinning the wafer may also involve a chemical mechanical planarization (CMP) process.

A particular problem encountered in the chemical mechanical planarization (CMP) process is known in the art as the "loading effect." A schematic of the loading effect is illustrated in FIG. 3 and 3A. As an example, it may be necessary to remove repetitive structures 20 to an endpoint such as to the surface of a substrate 12 or a different film layer formed on the substrate 12 using chemical mechanical planarization (CMP). During the chemical mechanical planarization (CMP) process the wafer 10 is pressed against a polishing pad 18 on the polishing platen of the chemical mechanical planarization (CMP) apparatus. Since these polishing pads 18 are typically formed of a relatively soft material, such as blown polyurethane, the polishing pad 18 may deform, as shown in FIG. 3, into the area between the structures 20 to be removed. As such, the surface of the substrate 12 may be contacted by the polishing pad 18. As the structures 20 are removed by the planarization process the surface of the substrate 12 is also removed by contact with the deformed polishing pad 18. As shown in FIG. 3A, this may cause an irregular or wavy surface 22 to be formed on the substrate 12. In general, this phenomena occurs on the micro level and has an adverse affect on the IC circuits formed on the wafer 10, especially in high density applications.

Another example of the loading affect is shown in FIGS. 4 and 4A. A wafer 10 may include a plurality of transistors 22 formed on the substrate. A protective or insulating layer of a dielectric material such as borophosphorus silicate glass (BPSG) 23 may be deposited over the transistors 22. An initial conformal deposition of the (BPSG) layer 23 may produce an irregular surface with peaks directly above the transistors 22 and valleys between the transistors. As before, the polishing pad 18 may deform to accommodate the irregular surface of the (BPSG) 23 layer. The resultant polished surface may appear on the micro level as wavy or irregular as shown in FIG. 4A.

The loading effect may function in other situations to remove the sides and base of features present on the surface of a wafer during chemical mechanical planarization (CMP). In addition, the loading effect may occur locally or globally across the surface of the wafer. In addition, this problem may be compounded by the velocity differential between the outer peripheral portions and the interior portions of the rotating semiconductor wafer. The faster moving peripheral portions of the semiconductor wafer may, for instance, experience a relatively larger rate of material removal than the relatively slower moving interior portions.

In view of the foregoing, there is a need in semiconductor manufacture for a chemical mechanical planarization (CMP) process that overcomes the loading effect. Accordingly, it is an object of the present invention to provide a (CMP) process in which the loading effect is eliminated and microscratches are removed from the wafer.

SUMMARY OF THE INVENTION

In accordance with the present invention a novel method for chemical mechanical planarization (CMP) of a semiconductor wafer suitable for eliminating the loading effect and for providing a polished surface free of micro scratches is provided. The method of the invention simply stated, is directed to a chemical mechanical planarization (CMP) process in which as a first step a relatively hard and low compressibility polishing pad is used for planarizing the wafer followed by a second step in which a high compressibility and low hardness pad material is used to remove micro-scratches. In general, a hard and low compressibility pad used in the first step will not deform into the wafer structure and provides a planar polishing surface. The topography of the wafer is thus contacted and polished along a planar surface. Such a hard pad material however, will form surface defects such as micro-scratches on the wafer surface. In subsequent processing the micro-scratches may be filled with metal such as an interconnect which may produce shorts in the completed semiconductor circuits. Accordingly, the second step of the process includes polishing the wafer with a high compressibility low hardness pad to remove micro-scratches from the planarized wafer surface.

The method of the invention can be used to planarize and polish a dielectric layer conformally deposited on a silicon substrate of the wafer. During the planarizing step the dielectric layer is placed in contact with the low compressibility pad for a time period that is sufficient to planarize the dielectric layer. This time period must also be long enough to remove defects caused by the low compressibility pad. During the first seconds of the planarizing step, the low compressibility pad can introduce micro-scratches and other defects. However, some of these defects will polish out as the planarizing step continues. The time period for the planarizing step is thus selected to remove the initial defects and accomplish a planar surface.

Following the planarizing step, the polishing step is carried out for a time period sufficient to polish out substantially all of the defects in the planarized dielectric layer. This requires that at least 50 Å of the dielectric layer be removed to minimize residual defects in the planarized dielectric layer. In addition to the time periods for the planarizing and polishing steps, other significant parameters include the rotational speed (i.e., rpms) of the polishing platen and the force with which the wafer is pressed against the polishing platen.

Stated differently, the chemical mechanical planarization (CMP) process of the invention includes the steps of: rotating a semiconductor wafer with respect to a polishing platen; planarizing a surface of the semiconductor wafer by contact with a planar contact surface of a hard low compressibility pad mounted to the polishing platen; and then polishing the wafer with a high compressibility, low hardness pad mounted to the polishing platen to remove micro-scratches formed during planarization.

Other objects, advantages, and capabilities of the present invention will become more apparent as the description proceeds.

BRIEF DESCRIPTION OF THE DRAWINGS

FIG. 1 is a prior art enlarged schematic view of a semiconductor wafer prior to chemical mechanical planarization (CMP);

FIG. 2 is a prior art enlarged schematic view of a semiconductor wafer after chemical mechanical planarization (CMP);

FIGS. 3 and 4 are prior art enlarged schematic views of a semiconductor wafer showing a chemical mechanical planarization (CMP) pad material deformed into the structure of the semiconductor wafer;

FIGS. 3A and 4A are prior art enlarged schematic views of a semiconductor wafer illustrating the loading effect on a semiconductor wafer surface;

DESCRIPTION OF PREFERRED EMBODIMENTS

Figure 5:
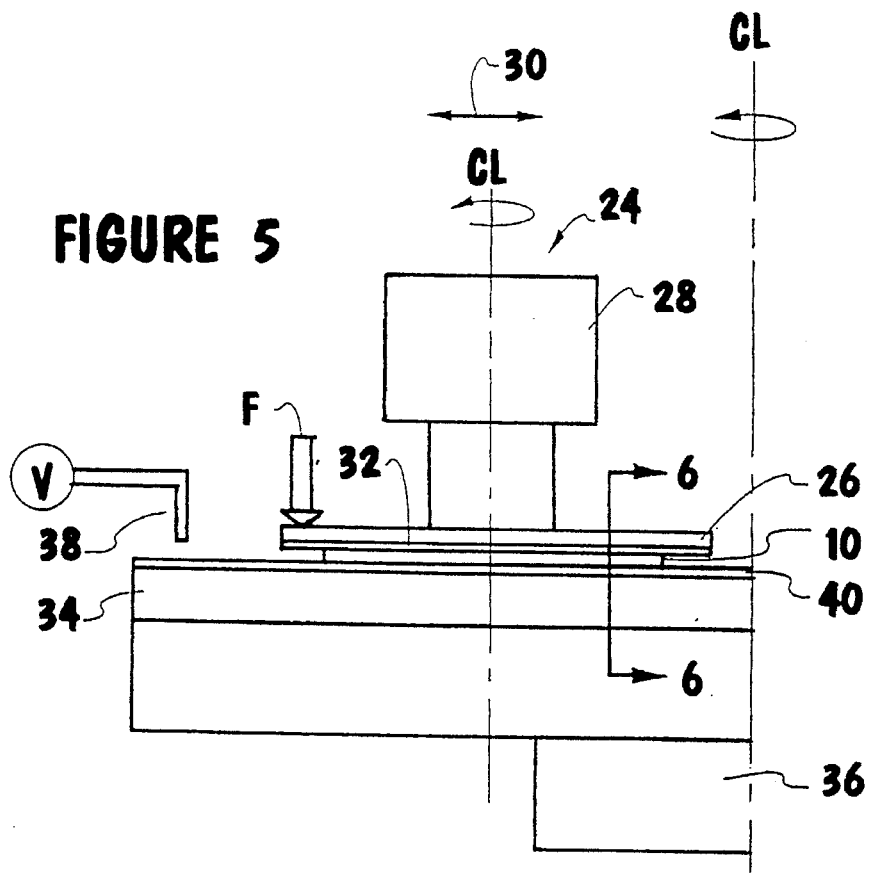
FIG. 5 is a schematic view of a chemical mechanical planarization (CMP) apparatus suitable for use with the method of the invention.

Referring now to FIG. 5 an apparatus suitable for performing a chemical mechanical planarization (CMP) process is shown and generally designated as 24. The chemical mechanical planarization (CMP) apparatus 24 includes a wafer carrier 26 for holding a semiconductor wafer 10. The wafer carrier 26 is mounted for continuous rotation by a drive motor 28. In addition the wafer carrier 26 is mounted for transverse movement along a polishing plane as indicated by double headed arrow 30. The wafer carrier 26 may include a carrier pad 32 formed of a soft material for contacting a backside of the wafer 10. Additionally, the wafer carrier 26 may include a vacuum holding means (not shown) for holding the wafer 10 in the wafer carrier 26 during the chemical mechanical planarization (CMP) process. The wafer carrier 26 is adapted to exert a downward pressure or force per square inch F on the wafer 10. The (CMP) apparatus 24 also includes a polishing platen 34 mounted for rotation by a drive motor 36. The polishing platen is relatively large in comparison to the wafer 10 so that during the (CMP) process the wafer 10 may be moved across the polishing platen 34 for planarizing and polishing the wafer 10. The polishing platen 34 may be formed of a hard incompressible material such as metal. A polishing slurry containing an abrasive medium, such as silica or alumina, is deposited through a conduit 38 onto the surface of the polishing platen 34.

A polishing pad 40 is mounted to the polishing platen 34. In accordance with the present invention during a planarizing step of the (CMP) process of the invention a polishing pad 40 is used that is formed of a hard and low compressibility material. During a subsequent polishing step of the (CMP) process of the invention the polishing pad 40 is formed of a soft compressible material for removing microscratches formed during the planarizing step.

During a planarizing step the polishing pad 40 is formed of a relatively hard and low compressibility material to provide a flat planar contact surface (46, FIG. 6) for planarizing the wafer 10. Such a pad material may be formed of a microporous blown polyurethane having a "Shore D" hardness of at least 35. A suitable pad having a Shore D hardness of 50±15% is sold by Rodel and designated as an IC 60 pad. This is in contrast to prior art polishing pads that are typically of a polyester urethane impegnated felt based material with an open pore structure. Such prior art pads typically have a "Shore A" hardness of 57±5.

Figure 6:
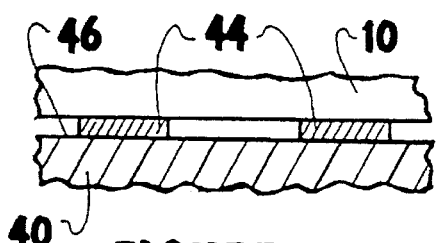
FIG. 6 is an enlarged partial cross section taken along section line 6—6 of FIG. 5 illustrating a planar polishing surface provided by a hard low compressibility pad material during a planarizing step of the method of the invention.
Figure 6A:
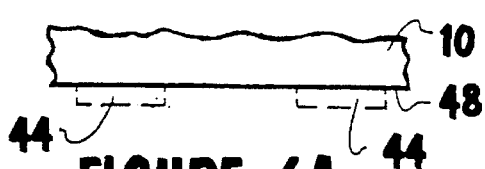
FIG. 6A is an enlarged partial cross section of a semiconductor wafer illustrating a planar surface formed in accordance with the method of invention.

In general, a hard low compressibility polishing pad 40 will not deform under a load as does the prior art soft compressible polishing pad 18 shown in FIG. 3. As shown in FIG. 6, a hard polishing pad 40 thus maintains a planar contact surface 46 with structures 44 on the wafer 10 to be planarized or removed. The highest topography of the wafer surface is thus removed sequentially along the planar contact surface 46 provided by the hard low compressibility polishing pad 40. After planarization of structures 44 on the wafer 10, and as shown in FIG. 6A, the top surface 48 of the wafer 10 is flat and planar. This is in contrast to the wave-like wafer surface 22 shown in FIG. 4 resulting from a soft conventional prior art polishing pad 18.

Figure 7:
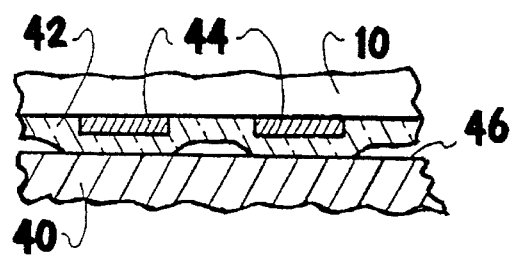
FIG. 7 is an enlarged partial cross section similar to FIG. 6.
Figure 7A:
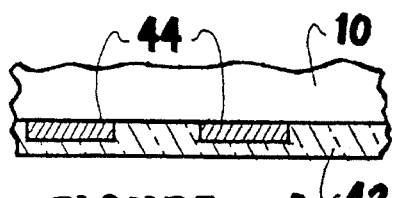
FIG. 7A is an enlarged partial cross section similar to FIG. 6A.

As shown in FIG. 7, the hard low compressibility polishing pad 40 also functions with an insulating layer 42 such as (BPSG) to sequentially remove the highest topography of the insulating layer 42. The planar contact surface 46 of the polishing pad 40 thus contacts the peaks and not the valleys associated with a conformal deposition of the insulating layer 42. This not only forms a flat planar surface on the insulating layer 42, as shown in FIG. 7A, but in addition allows a thinner insulating layer 42 (i.e. BPSG) to be used. This is because with a hard low compressibility polishing pad 40, it is less likely that a valley portion of the insulating layer 42 will be contacted and completely removed or punched through.

Subsequent to planarizing the wafer 10, with a hard low compressibility pad material 40, the wafer 10 must be polished to remove micro-scratches formed by the hard pad during planarization. This subsequent polishing step can be performed with a polishing pad 40 formed of a soft compressible material such as blown polyurethane. Such a soft compressible polishing pad 40 used during the polishing step will not introduce a loading effect because the surface of the wafer is flat and planar from the planarizing step. As an example the soft pad may be formed of a poromeric material grown in place on a compressible substrate. Such a material may be about 7 mils (±4) thick and with a vertical pore height of about 20 mils (±3). Such a pad may be obtained from Rodel and designated as a Polytex Supreme.

Figure 8:
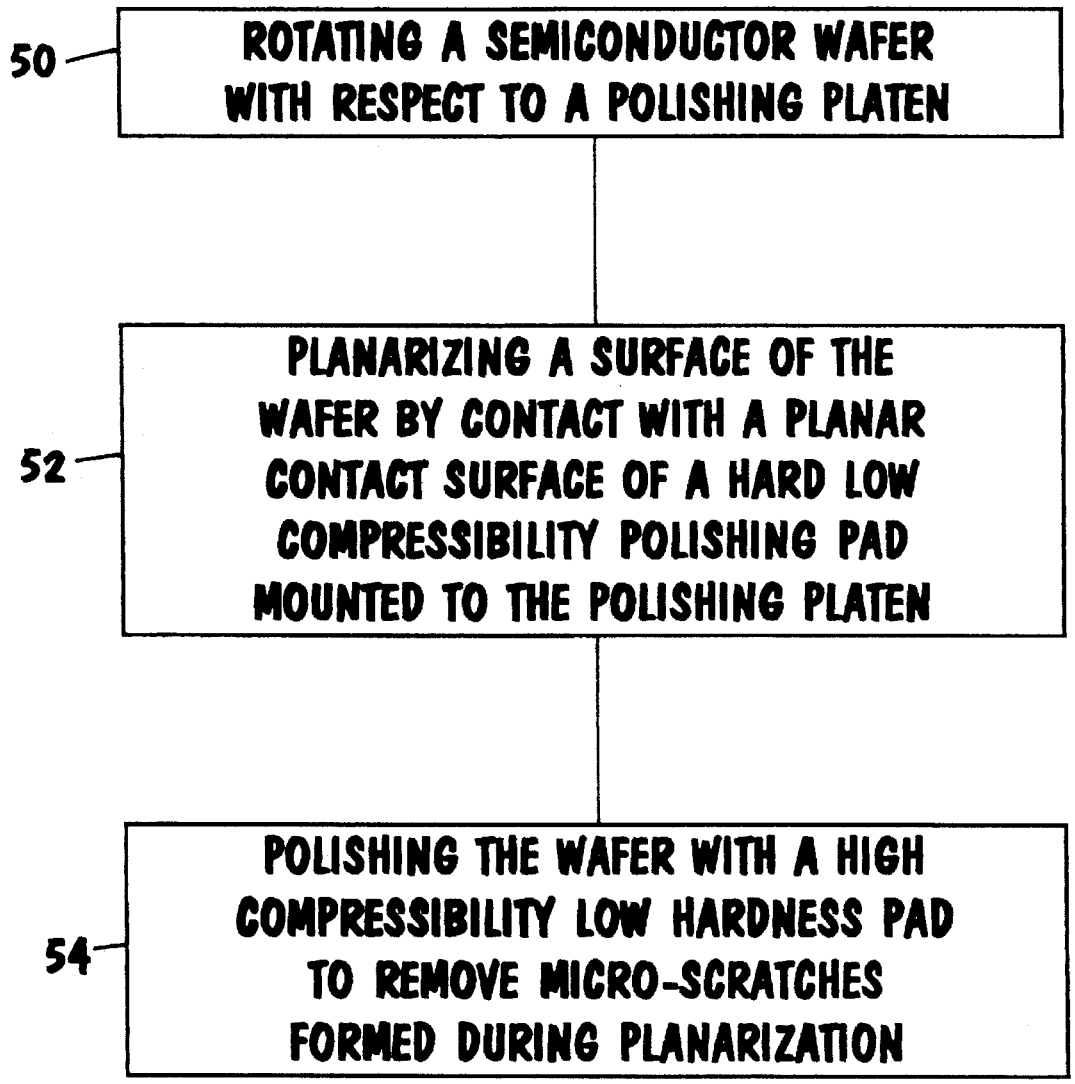
FIG. 8 is a block diagram illustrating the steps of the method of the invention.

With reference to FIG. 8, the method of the invention can be summarized as, a method of chemical mechanical planarization (CMP) for eliminating a loading effect including the steps of:

rotating a semiconductor wafer with respect to a polishing platen, step 50;

planarizing a surface of the wafer by contact with a planar contact surface of a hard low compressibility polishing pad mounted to the polishing platen, step 52; and polishing the wafer with a high compressibility low hardness pad to remove micro-scratches formed during planarization, step 54.

In addition to eliminating the loading effect during chemical mechanical planarization (CMP), the process of the invention also improves the semiconductor manufacturing process by allowing the use of thinner protective coatings such as BPSG (borophosphorus silicate glass) on the wafer surface. This is because it is less likely that a portion of the protective coating will be completely removed or punched through during the chemical mechanical planarization (CMP) process.

In addition, since the chemical mechanical planarization (CMP) process can be more accurately controlled to achieve a planar surface, the process window for the planarization process is improved. Moreover, the chemical mechanical planarization (CMP) process can be performed at a lower cost with improved results (i.e. planarized surface free of micro-scratches). In addition, with a planarized oxide coating, a subsequent photolithographic process can be improved. As an example, reflective notching caused by an irregular surface can be eliminated. Moreover, a better line width control is possible during the photolithographic process. Finally, an improved semiconductor yield is provided because the (CMP) process of the invention reduces the number of metal defects on the wafer.

EXAMPLE

Tests were performed on wafers having a conformally deposited interlevel dielectric layer (ILD). In these tests, the interlevel dielectric layer was formed using tetraethylorthosileate (TEOS). One object of the tests was to determine the frequency and distribution of defects at the surface of the interlevel dielectric layer during a chemical mechanical planarization method conducted in accordance with the invention. Another object of the tests was to determine a time profile of defect generation during the planarizing step. Another object was to evaluate the effectiveness of the polishing step using different process parameters.

The TEOS was blanket deposited to a thickness of 14.5 kÅ on two groups of wafers. Group A was reclaimed wafers and Group B was virgin wafers. Defects were detected using a commercially available Censor ANS particle detector. This instrument detects scattered light as a function of position on the dielectric surface. The detector sensitivity is controlled by adjusting the PMT voltage. One can also set an LPD (light point defect) threshold, i.e. the intensity at which an LPD is distinguished from haze causing scattering of the incident beam. Two combinations of settings were used in these experiments, a low sensitivity setting and a high sensitivity setting corresponding to 220 Volts PMT/5.10 LPD threshold and 280 Volts PMT/4.00 LPD threshold, respectively. A scratch was defined as 5 concurrent LPDs.

A chemical mechanical planarization apparatus was used as previously described. During the planarizing step an IC-60 pad sold by Rodel Products Corp., Scottsdale, Ariz. was used. This pad is termed herein as the "planarizing pad". The down force per square inch (i.e., F—FIG. 5) was set at 7.0 psi. The polishing platen (i.e., 34—FIG. 5) was rotated at 45 rpm.

Figure 9:
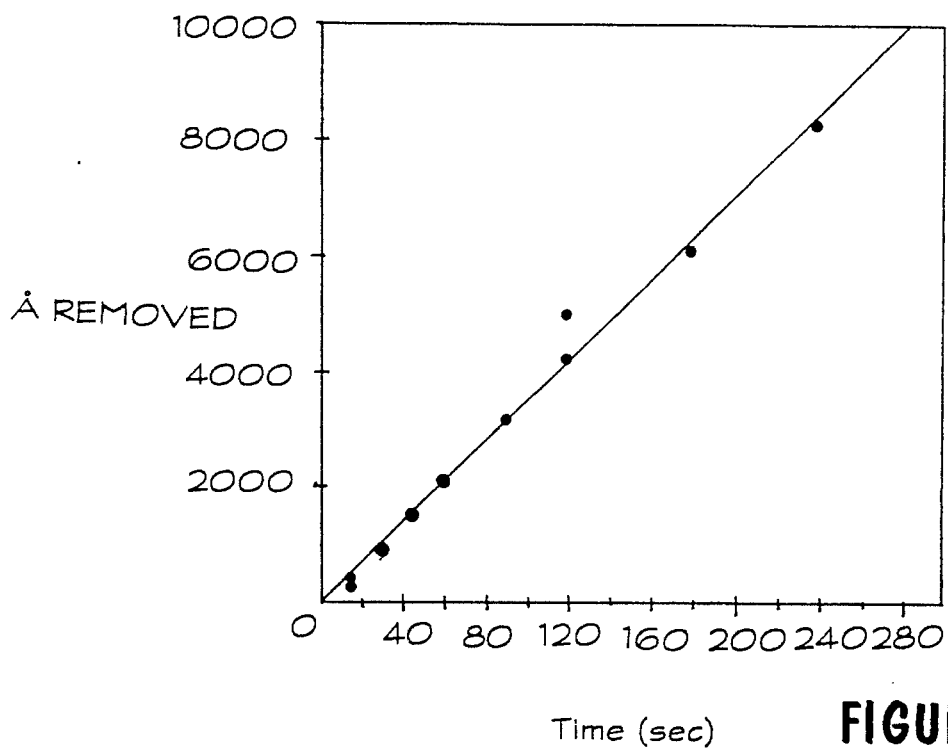
FIG. 9 is a graph showing the removal rate in angstroms for an interlevel dielectric layer as a function of planarizing time using an IC-60 pad at a pressure of 7.0 psi and at a rotational speed for the planarizing pad of 45 rpm.
Figure 10:
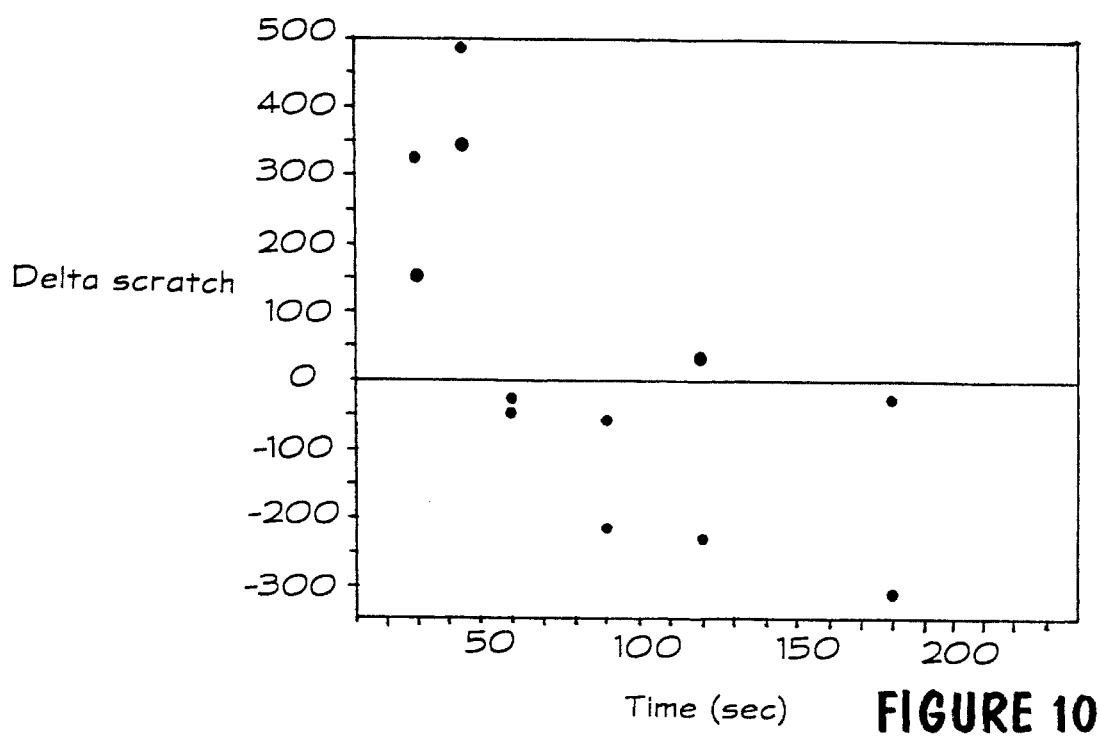
FIG. 10 is a graph showing the changes in the number of scratches as a function of planarizing time for Group A wafers at a low sensitivity setting.
Figure 11:
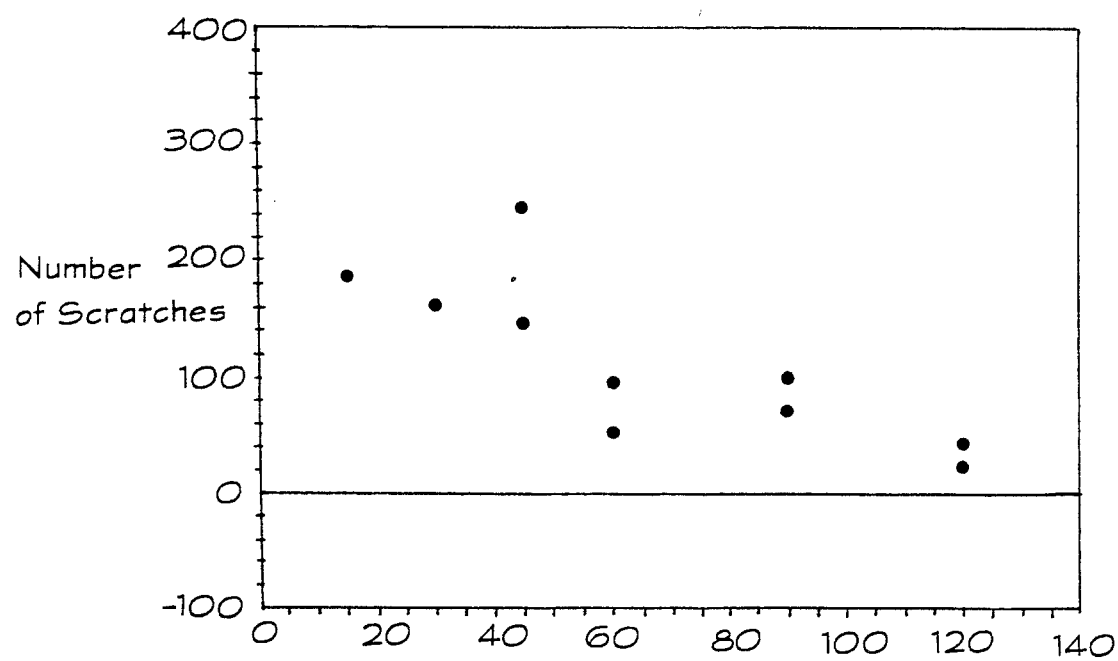
FIG. 11 is a graph showing the changes in the number of scratches as a function of planarizing time for Group B wafers at a low sensitivity setting.
Figure 12:
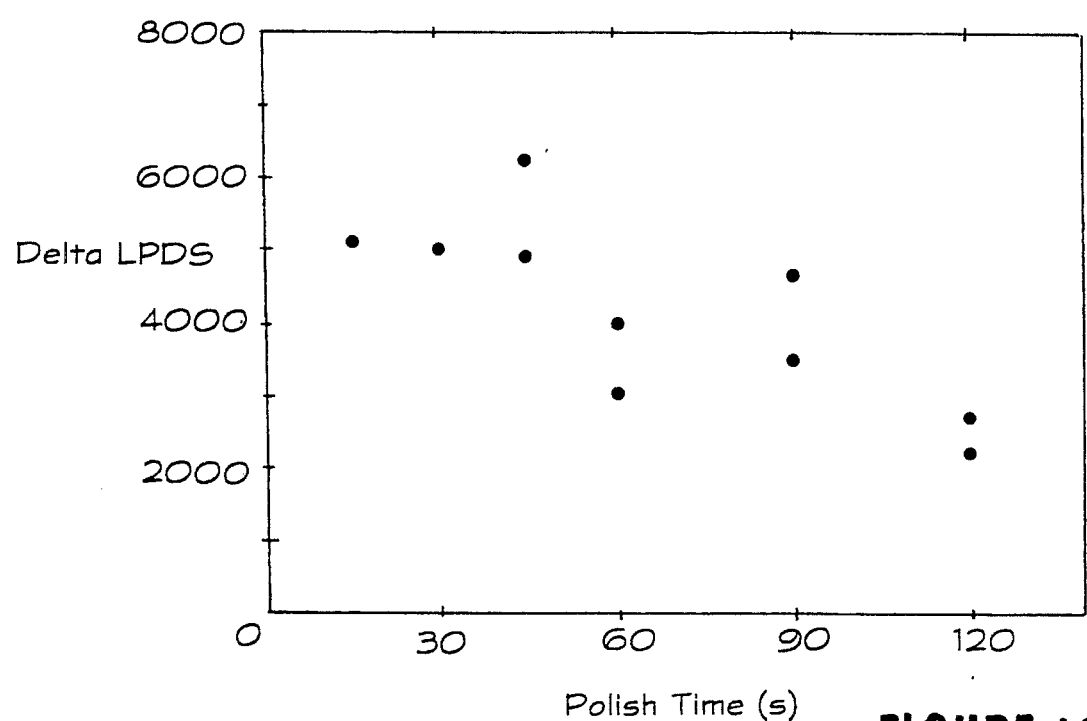
FIG. 12 is a graph showing changes in the number of light point defects as a function of planarizing time for Group B wafers at a low sensitivity setting.

FIG. 9 illustrates the thickness of material removed in angstroms as a function of the planarizing time in seconds. FIG. 10 illustrates the number of ILD scratches for Group A wafers as a function of the planarizing time in seconds at a low sensitivity setting. FIG. 11 illustrates the number of ILD scratches for Group B wafers as a function of the planarizing time in seconds at a low sensitivity setting. FIG. 12 illustrates the changes in the number of light point defects (LPDs) as a function of planarizing time for Group B wafers at a low sensitivity setting.

From this data it was determined that the planarizing step introduced defects in the TEOS dielectric layer. A majority of defects caused by planarizing on the IC-60 pad occurred during the first minute of contact with the planarizing pad. It was also determined that within two minutes many of the large defects introduced during the planarizing step were removed. It was therefore concluded that the planarizing step should be performed for a time period sufficient to remove the defects caused by initial contact with the planarizing pad. This time period is at least 30 seconds. A preferred time period for the planarizing step is at least two minutes.

Figure 13:
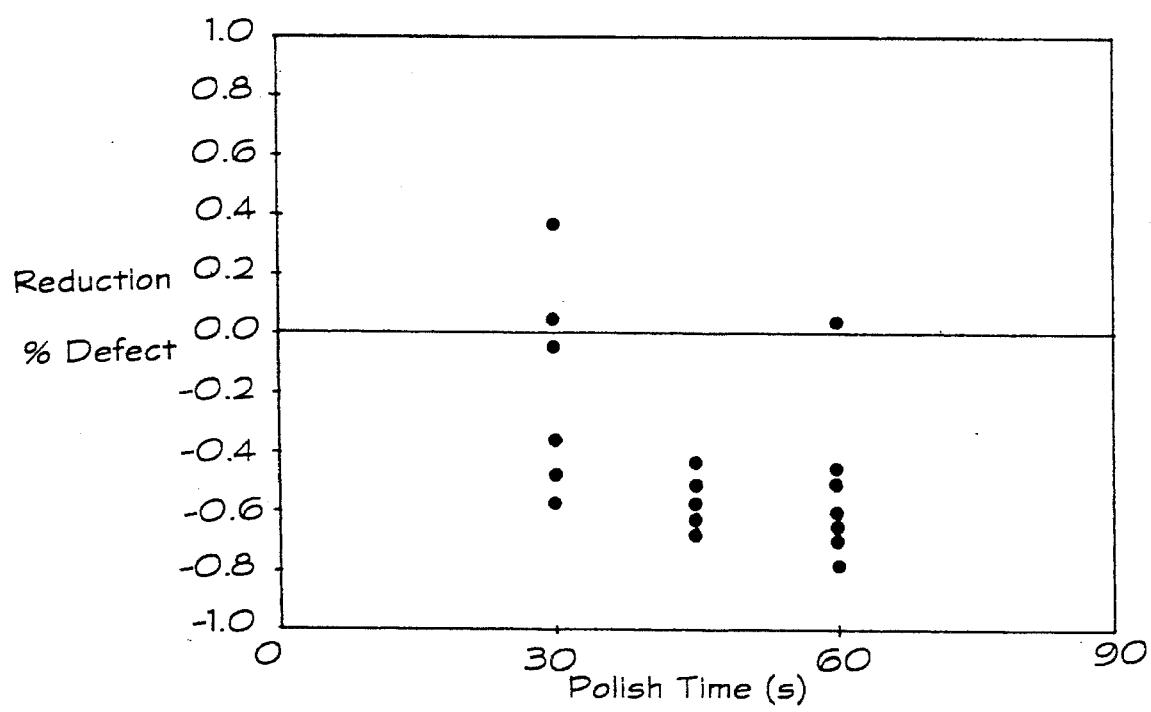
FIG. 13 is a graph showing changes in the number of scratches as a function of polishing time for Group B wafers at 5 psi and 15 rpms.

Following the planarizing step, a polishing step was performed using a Polytex pad, referred to herein as the polishing pad, manufactured by Rodel Products Corp., Scottsdale, Ariz. Wafers that had been previously planarized using the planarizing pad were polished using the polishing pad for 30, 45 or 60 seconds to evaluate the efficiency of the polishing step for removing defects. During the polishing step the down force per square inch (F) and the rotational speed of the polishing platen were also varied to evaluate the effect of these parameters on defect removal. FIG. 13 illustrates the changes in the number of scratches as a function of polish time for Group B wafers at 5 psi and 15 rpms. This data has been normalized by dividing the difference in planarization polish scratch numbers by the planarization number.

Several different polish schemes were run on the wafers from Group B to arrive an optimal polish parameters. The results in terms of average LPD and scratch numbers are presented in Table I.

TABLE I

| wafer # | primary polish | final polish (7 psi) | final polish (5 psi) | high sensitivity | | low sensitivity | |
|---|---|---|---|---|---|---|---|
| | | | | LPDs | Scratch | LPDs | Scratch |
| 2, 9 | 3'00" | 0 | 1'00" | 4358 | 145 | 580 | 4 |
| 3, 8 | 2'30" | 30" | 1'00" | 1790 | 15 | 313 | 1 |
| 4, 7 | 2'30" | 30" | 30" | 1800 | 18 | 353 | 1 |
| 5, 6 | 2'00" | 1'00" | 30" | 867 | 3 | 166 | 0 |

For the polishing step, the data indicated that there is an increase in defect reduction with increasing polish pressure and platen speed. A 30–60 second polishing step at 5.0 psi, 15 rpms removes only 20–50% of the defects generated in the planarizing step. Polishing for 30–60 seconds at 7.0 psi, 40 rpms removes approximately 90% of the defects. The final polishing step should remove at least 50 Å of material and preferably 1000 Å in order to minimize residual defects.

Thus the invention provides a simple yet unobvious method for improving the chemical mechanical planarization (CMP) process during semiconductor manufacture. While the method of the invention has been described with reference to a preferred embodiment thereof, as will be apparent to those skilled in the art, certain changes and modifications can be made without departing from the scope of the invention as defined by the following claims.

We claim:

1. A method of chemical mechanical planarization comprising:
   providing a semiconductor wafer including a substrate and a dielectric layer formed thereon;
   planarizing the dielectric layer by placing the wafer in contact with a rotating first polishing pad having a planar surface for a first time period sufficient to planarize the dielectric layer and to remove at least some defects; and
   following planarizing the dielectric layer, polishing the dielectric layer by placing the wafer in contact with a rotating second polishing pad formed of a compressible material for a second time period sufficient to remove at least 50 Å of material and from 50–90% of defects formed during the planarizing step.

2. The method as claimed in claim 1 and wherein the first time period is at least thirty seconds.

3. The method as claimed in claim 1 and further comprising moving the wafer across the first and second polishing pads during the planarizing and polishing steps.

4. The method as claimed in claim 1 and further comprising placing the wafer in contact with the first and second polishing pads with a pressure between about 5 to 7 psi.

5. The method as claimed in claim 1 and wherein the dielectric layer is selected from the group of materials consisting of borophosphosilicate glass and an oxide.

6. A method of chemical mechanical planarization comprising:
   providing a semiconductor wafer including a substrate and a dielectric layer formed thereon;
   planarizing the dielectric layer by placing the wafer in contact with a rotating first polishing pad having a planar surface and a Shore D hardness of at least 35 for a first time period of at least thirty seconds to remove at least some defects; and
   following planarizing the dielectric layer, polishing the dielectric layer to remove at least 50 Å of material and from 50–90% of defects formed during the planarizing step by placing the wafer in contact with a rotating second polishing pad formed of a compressible material for a second time period of at least thirty seconds.

7. The method as claimed in claim 6 and wherein the defects include micro-scratches.

8. The method as claimed in claim 7 and wherein the wafer carrier is adapted to place the wafer in contact with the first and second polishing pads with a pressure of from 5.0–7.0 psi.

9. The method as claimed in claim 7 and wherein the second time period is from 30–60 seconds.

10. The method as claimed in claim 9 and wherein the dielectric layer is a conformally deposited oxide.

11. The method as claimed in claim 9 and wherein the dielectric layer is selected from the group of materials consisting of borophosilicate glass and an oxide.

12. A method of chemical mechanical planarization comprising:

providing a semiconductor wafer including a substrate and a dielectric layer formed thereon;

providing a chemical mechanical planarization apparatus including a polishing platen adapted to rotate and a rotatable wafer holder adapted to hold the wafer against the polishing platen with a pressure and to move the wafer across the polishing platen;

holding and rotating the wafer against a first polishing pad mounted to the polishing platen for a first time period of at least thirty seconds, said first polishing pad formed of a microporous blown polyurethane material having a planar surface and a Shore D hardness of greater than 35, to planarize the dielectric layer and to remove at least some defects; and following planarizing the dielectric layer, holding the wafer against a second polishing pad formed of a compressible material for a second time period, to polish the dielectric layer and remove at least 50 Å of material and from 50–90% of defects formed during the planarizing step.

13. The method as claimed in claim 12 and wherein the wafer holder holds the wafer against the polishing platen with a pressure of from 5.0–7.0 psi.

14. The method as claimed in claim 12 and wherein the second time period is from 30–60 seconds.

15. The method as claimed in claim 12 and wherein the dielectric layer is selected from the group of materials consisting of borophosphosilicate glass and an oxide.

16. The method as claimed in claim 12 and wherein the dielectric layer is conformally deposited on the wafer substrate and includes peaks contacted and removed during the planarizing step.

17. The method as claimed in claim 12 and wherein the dielectric layer is conformally deposited on the wafer substrate and includes valleys not contacted and removed during the planarizing step.

* * * * *

UNITED STATES PATENT AND TRADEMARK OFFICE
CERTIFICATE OF CORRECTION

PATENT NO. : 5,514,245
DATED : May 7, 1996
INVENTOR(S) : Trung T. Doan; Malcolm Grief; Laurence D. Schultz It is certified that error appears in the above-indentified patent and that said Letters Patent is hereby corrected as shown below:

Title page, item [54] and column 1, line 1

In the title after "CHEMICAL" add --MECHANICAL--.

Signed and Sealed this

Thirtieth Day of July, 1996

Attest:

BRUCE LEHMAN

*Attesting Officer*   *Commissioner of Patents and Trademarks*